United States Patent [19]
Roth et al.

[11] Patent Number: 5,719,884
[45] Date of Patent: Feb. 17, 1998

[54] ERROR CORRECTION METHOD AND APPARATUS BASED ON TWO-DIMENSIONAL CODE ARRAY WITH REDUCED REDUNDANCY

[75] Inventors: Ron M. Roth, Ramat Gan, Israel; Gadiel Seroussi, Cupertino, Calif.

[73] Assignee: Hewlett-Packard Company, Palo Alto, Calif.

[21] Appl. No.: 508,019

[22] Filed: Jul. 27, 1995

[51] Int. Cl.$^6$ .................................................. H03M 13/00
[52] U.S. Cl. .................. 371/37.4; 371/37.1; 371/37.5; 371/37.7
[58] Field of Search .................. 371/37.1, 37.4, 371/37.5, 37.7; 365/130, 129

[56] References Cited

U.S. PATENT DOCUMENTS

| | | | |
|---|---|---|---|
| 5,365,530 | 11/1994 | Yoshida | 371/37.4 |
| 5,392,299 | 2/1995 | Rhines et al. | 371/37.5 |
| 5,400,347 | 3/1995 | Lee | 371/37.5 |
| 5,432,800 | 7/1995 | Kuroda et al. | 371/37.7 |

OTHER PUBLICATIONS

"New Classes of Binary Codes Constructed on the Basis of Concatenated Codes and Product Codes", IEEE Transactions of Information Theory, vol. IT-22, No. 4, pp. 462-467, Jul. 1976.

"A Survey of Array Error Control Codes", ETT, Col. 3, No. 5, pp. 441-454, Sep.-Oct. 1992.

S. Wicker and V. Bhargava, "Reed-Solomon Codes and Their Applications", IEEE Press, New York, Chapters, 1, 5, and 10, 1994.

Gadiel Seroussi, "A Systolic Reed-Solomon Encoder", 37 IEEE Transactions on Information Theory, pp. 1217-1220, 1991.

*Primary Examiner*—Reba I. Elmore
*Assistant Examiner*—McDieunel Marc

[57] ABSTRACT

An error correction system reduces redundancy of a two-dimensional product code array by eliminating an excess redundancy in prior product codes that provides detection of more corrupted rows than can be corrected. The product code array is formed utilizing a row coding, a column coding, and an intermediate coding, which may each be Reed-Solomon codes. The product code array has a total redundancy of $n_1 r_2 + r_1 r_2$ symbols, where $r_1$ is the redundancy of the row coding, $r_2$ is the redundancy of the column coding, and raw data symbols fill a $k_1$ by $k_2$ and a $r_1$ by $(k_2-r_2)$ symbol portions of the product code array. A decoder for the product code array is capable of detecting and correcting up to $r_2$ corrupted rows of the product code array.

20 Claims, 9 Drawing Sheets

ERROR CORRECTION METHOD AND APPARATUS BASED ON TWO-DIMENSIONAL CODE ARRAY WITH REDUCED REDUNDANCY

FIELD OF THE INVENTION

The present invention relates generally to encoding data for transmittal or storage with redundant information so that errors can be detected and corrected upon receipt or retrieval of the data, and more particularly relates to two-dimensional code arrays used for error correction in communications and storage channels.

BACKGROUND AND SUMMARY OF THE INVENTION

Error correction codes are commonly used in both communications and storage channels to combat data corruption caused by channel noise, media defects, or other interference. A typical communications and/or storage system utilizing error correction is shown in FIG. 1. Some examples of the-applications in which error correction codes are used include: data transmission, broadcasting, and satellite communications in the communications field; and digital sound and video recording, magnetic tapes, semiconductor memories, and compact disks in the information storage field.

In the case of error correction codes known as "block codes," protection against errors is achieved by dividing the data into fixed size blocks (referred to as "raw data blocks") having an integer number, k, of "symbols" each. (Symbols are elements of an alphabet or set of values. In the case of digital information, symbols typically are multi-bit values of a fixed bit length. For example, commonly used alphabets for digital information such as the 256 symbol ASCII alphabet, generally comprise symbols which are 8-bit bytes.) An encoder appends an integer number, r, of redundancy symbols (referred to as "check symbols" or "checks") to each raw data block to form an n-symbol "code block," where n=k+r. This code block is then sent through the communications or storage channel. (For example, the code block is stored on a recording medium such as a magnetic tape or compact disk, or transmitted on a communications medium such as on a telephone wire, a computer network, or a wireless channel, where the code block may become corrupted.) On the receiving side, a decoder uses the redundant information to retrieve the original raw data from a possibly corrupted version of the code block, provided the corruption does not exceed a certain pre-designed level.

"Product codes" are a popular choice of error correction code in magnetic recording and like applications where both random and burst errors are likely, due to their ability to offer good protection against both these types of errors. (Random errors are those that occur independently at separate symbol positions of data sent through a communications or storage channel. Burst errors affect a sequential set of symbols in data sent through a communications or storage channel. For example, an electrical disturbance in a communications channel or a media defect in a storage channel can create errors in several adjacent symbols sent through these channels.) In a typical product code encoder such as that shown in FIG. 4, a two-dimensional array is built using two Reed-Solomon codes operating on 8-bit symbols. A first code $C_1$ of length $n_1$ symbols and redundancy $r_1$ symbols is applied to the rows of the array. A second code $C_2$ of length $n_2$ symbols and redundancy $r_2$ symbols is applied to its columns. This yields array dimensions of $n_1 \times n_2$ symbols. In such case, the total redundancy of the array is $n_1 r_2 + n_2 r_1 - r_1 r_2$ symbols per block of $n_1 n_2$ symbols. Using a decoding strategy based on detecting errors with $C_1$ and correcting erasures with $C_2$ such as illustrated in FIG. 5, this scheme can correct all error bursts affecting $r_2$ rows or less, except possibly for a small set of burst error patterns whose probability can be made arbitrarily small by an appropriate choice of the parameter $r_1$. (Many variations on this basic strategy are possible, offering a trade-off between random- and burst-error correction. Various conventional implementations of product code encoders and decoders are described in P. Farrell, *A Survey of Array Error Control Codes*, 3 ETT 441–454 (1992).)

Reed-Solomon codes are well known block codes for which efficient encoders and decoders have been developed based on algebraic computations over finite fields. A typical encoder and a decoder for Reed-Solomon codes are shown in FIGS. 2 and 3, respectively. Reed-Solomon codes exist for any code block length of n symbols less than q+1, where the alphabet of the data includes q symbols. In typical applications, a symbol consists of m binary bits, where m is a positive integer, and $q=2^m$ (e.g. m=8, q=256). Reed-Solomon codes are particularly useful error correction codes in that these codes attain a theoretical minimum redundancy cost in error detection and correction operations, as shown in the following table 1.

TABLE 1

Redundancy Cost of Error Correction Operations

| Error Correction Operation | Minimum Cost |
|---|---|
| error detection | 1 check symbol/error |
| erasure correction | 1 check symbol/erasure |
| full error correction | 2 check symbols/error |

In an error detection operation, the decoder determines whether there are corrupted symbols within a block without determining their location. Reed-Solomon codes can detect any pattern of up to r errors (where r is the redundancy of the code). In product code applications, Reed-Solomon codes can further detect burst errors with a probability of 1-ε, where ε is a number that decreases exponentially with r (assuming each bit in the region affected by the burst error is corrupted with probability 0.5), such as $1-q^{-1}$. In an erasure correction operation, the decoder recovers the values of all corrupted symbols given their locations within the code block. In a full error correction operation, the decoder recovers both the locations of all corrupted symbols within a code block, and their values. Reed-Solomon codes can correct any pattern of up to r/2 full errors, or up to r erasures, or any combination in which 2x(errors)+(erasures)≤r, where "errors" is the number of errors and "erasures" is the number of erasures.

There is a further distinction between deterministic (or worst-case) and probabilistic decoding schemes. In a deterministic decoding scheme, the decoder is guaranteed to correct all patterns of up to a pre-designed number of errors (e.g. all errors of up to N corrupted rows in a two dimensional array, for some integer N). In a probabilistic scheme, the decoder corrects such patterns with a probability that can be made arbitrarily close to 1, under certain assumptions on the distribution of error patterns. These assumptions are well approximated in practice by the use of scramblers prior to transmission through the channel. By relaxing the error correction requirements from "always" to "with high probability," one can significantly reduce the amount of redundancy in the coding scheme. M. Kasahara, S. Hirasawa, Y. Sugiyama, and T. Namekawa, *New Classes of Binary Codes Constructed on the Basis of Concatenated Codes and Product Codes*, IEEE Transactions on Information Theory, 462–467 (1976) [hereafter Kasahara], describe a scheme that reduces the redundancy of binary product codes, while preserving the minimum Hamming distance (and, hence, the worst-case correction capabilities) of the code. Due to their objective of preserving worst-case correction capabilities, Kasahara achieves limited code redundancy reduction.

In typical prior product codes, the code $C_1$ which is applied to the rows of the array is used to detect whether each respective row has become corrupted. The code $C_2$ that is applied to the array's columns is used to perform an erasure correction operation that corrects erasure of those rows identified as corrupted by application of code $C_1$. In other words, the detection operation of code $C_1$ is utilized to inform the erasure correction operation of code $C_2$ as to which rows are corrupted, so that the erasure correction operation can correct locations corresponding to those rows identified as corrupt in each column of the array. When designing such product codes, the redundancy $r_1$ of the code $C_1$ is generally chosen so that the probability of $C_1$ not detecting a corrupted row, which is approximately equal to $a^{-r_1}$, is acceptably small. The redundancy $r_2$ of the code $C_2$ generally is chosen such that the probability of having more than $r_2$ corrupted rows is acceptably small.

One drawback to these prior product codes, however, is that although the code $C_1$ is able to detect whether up to all $n_2$ rows of the product array are corrupted (the code $C_1$ is applied to each row of the array and therefore can detect whether each row is corrupted), the code $C_2$ is only able to correct up to $r_2$ locations (corresponding to such identified, corrupted rows) per column. Since the code $C_2$ can correct only up to $r_2$ corrupted rows, the information derived from the code $C_1$ about combination of any more than $r_2$ corrupted rows is useless to the erasure correction operation with the code $C_2$. The ability of the code $C_1$ to detect these extra rows (which in any case cannot all be corrected) comes at a price of added redundancy. As a result, a significant portion of the redundancy in these typical prior product code arrays serves no useful purpose.

The present invention provides an apparatus and method which eliminates the excess redundancy related to the unused error detection capability of the code $C_1$ in these typical prior product code arrays based on probabilistic decoding. The apparatus and method of the present invention are based on a two-dimensional code array which utilizes a third, intermediate code (herein referred to as $C_{1.5}$) in addition to the codes applied to the rows and columns of the array (herein referred to as $C_1$ and $C_2$, respectively). The resulting redundancy in the two-dimensional code array according to a preferred embodiment of the present invention is equal to $n_1r_2+r_1r_2$, which is smaller by $r_1(n_2-2r_2)$ than the redundancy in a typical prior product code array. The present invention therefore achieves reduced redundancy (which in communications and storage channels means greater raw data throughput) with the same error correction capability as previous communications and storage devices and methods based on typical prior product codes.

According to a further feature of the preferred embodiment of the invention, the row and column codes $C_1$ and $C_2$, as well as the intermediate code $C_{1.5}$, are each Reed-Solomon codes. The apparatus of the preferred embodiment therefore can be constructed using conventional Reed-Solomon encoders and decoders arranged in a new and unique manner to encode and decode the two-dimensional code arrays of the invention which achieve reduced redundancy.

Because the present invention is based on probabilistic decoding, a more substantial improvement in code redundancy is achieved as compared to deterministic schemes such as disclosed in Kasahara. Kasahara's different objective of preserving worst-case correction capabilities also dictates different decoding strategies and apparatus.

Additional features and advantages of the invention will be made apparent from the following detailed description of a preferred embodiment which proceeds with reference to the accompanying drawings.

DETAILED DESCRIPTION OF THE PREFERRED EMBODIMENTS

Figure 1:
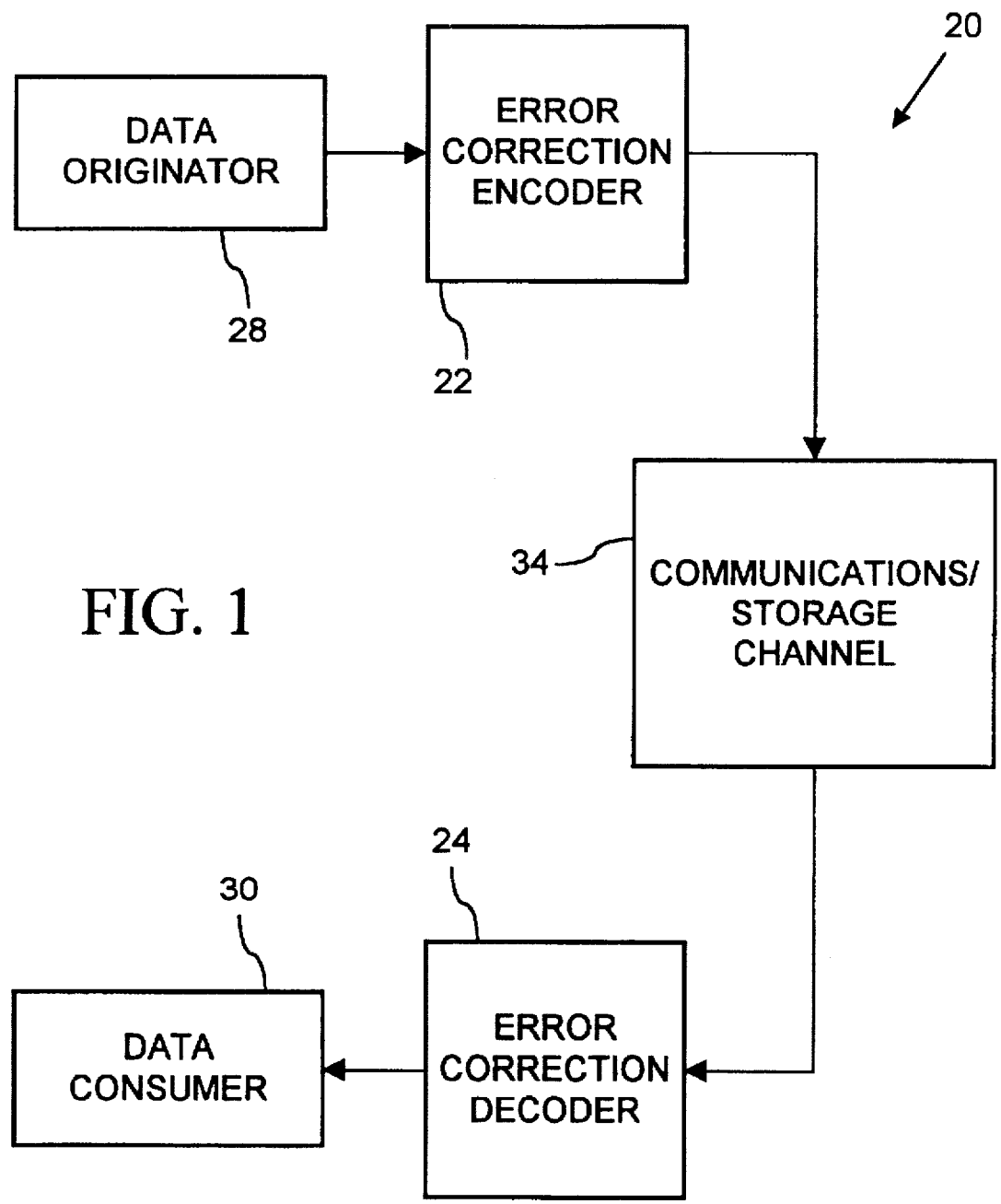
FIG. 1 is a generalized block diagram of a communications and/or storage system utilizing encoding and decoding for error correction.

FIG. 1 shows a communications and/or information storage system 20 comprising an encoder 22 and a decoder 24 for error correction. Digital data is input at one end of system 20 by a data originator device 28 ("data source"), and output at an opposite end to a data consumer device 30 ("data sink"). The data is transferred between data originator 28 and data consumer 30 by a communications and/or storage channel 34 which potentially corrupts the data with random and/or burst errors. In the case of communications applications, channel 34 can comprise equipment for transmitting digital data between two sites, such as transmitters, receivers, tuners, transmission medium (wire, cable, or antennas), modulators, demodulators, and the like. In the case of information storage applications, channel 34 can comprise equipment for storing digital data, such as recording devices using magnetic recording media, optical recording media, semiconductor memory, and the like, including magnetic tape drives, compact disk drives, and computer memory chips. In some cases, particularly in storage applications, a same device can be utilized as both data originator 28 and data consumer 30. Additionally, channel 34 may include both communications and information storage equipment, such as in the case of a computer network where individual work stations store digital information on a shared file server accessed over a local area network.

During transfer on channel 34, the digital data may become corrupted due to noise, interference, media defects, or other causes. So that data received at data consumer 30 is not corrupted, encoder 22 encodes the data using error correction coding before the data enters channel 34. When the data exits channel 34, decoder 24 employs error correction operations based on the error correction code or codes employed by encoder 22 to restore the corrupted data.

Figure 6:
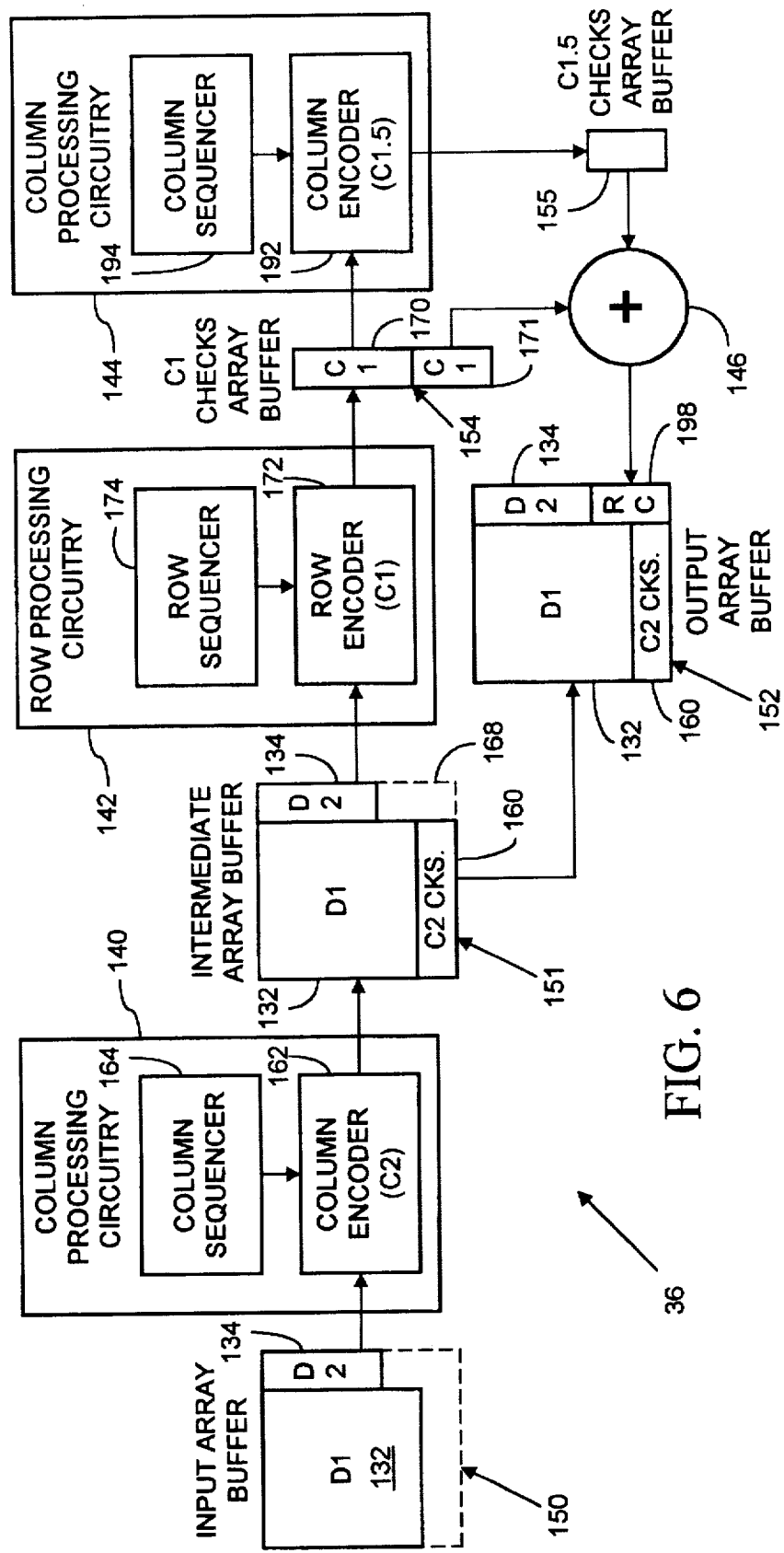
FIG. 6 is a block diagram of an encoder that can be utilized in the system of FIG. 1 according to a preferred embodiment of the invention for error correction encoding based on a two-dimensional code array with reduced redundancy.
Figure 8:
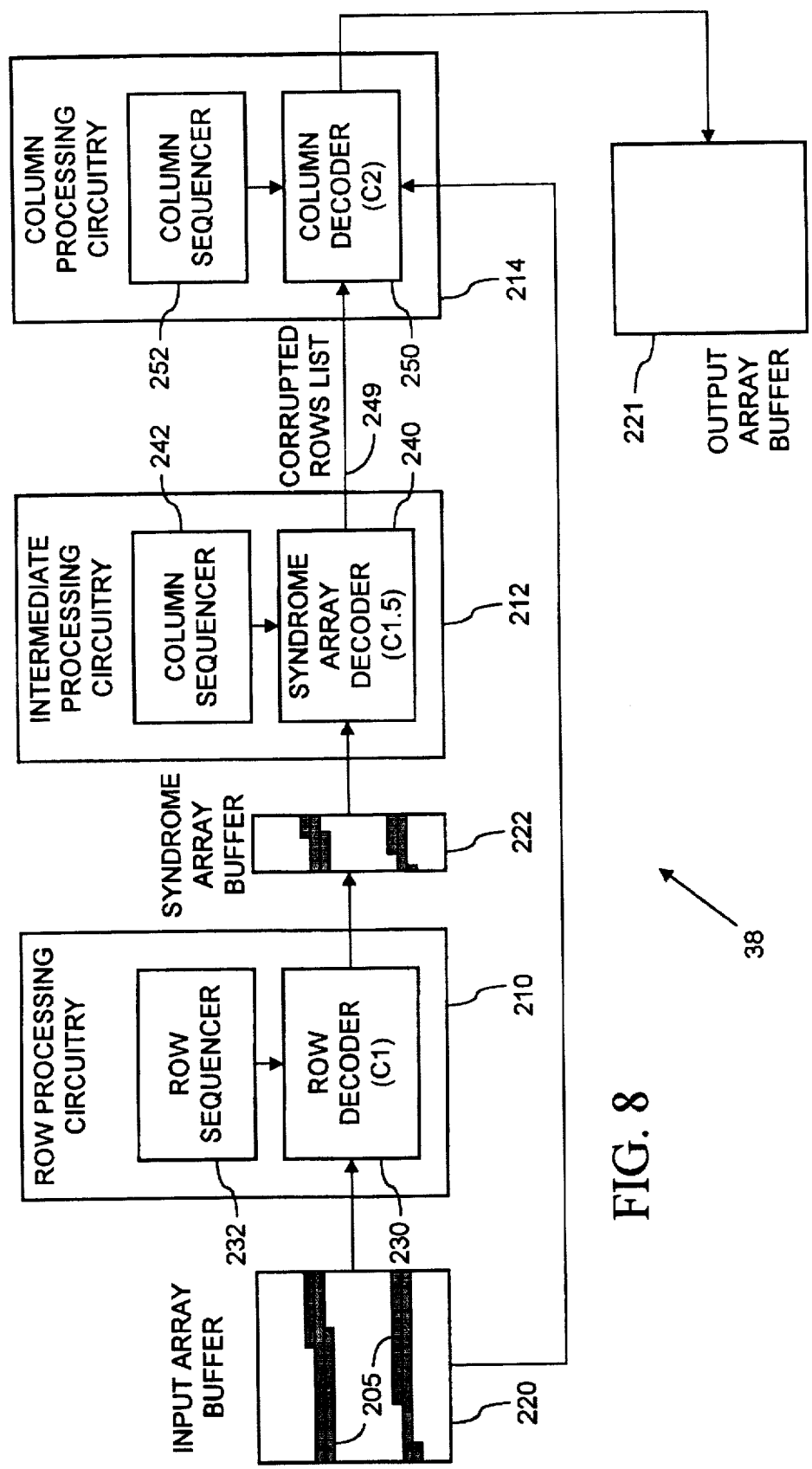
FIG. 8 is a block diagram of a decoder that can be utilized in the system of FIG. 1 according to the preferred embodiment of the invention for correcting burst errors based on a two-dimensional code array with reduced redundancy.
Figure 9:
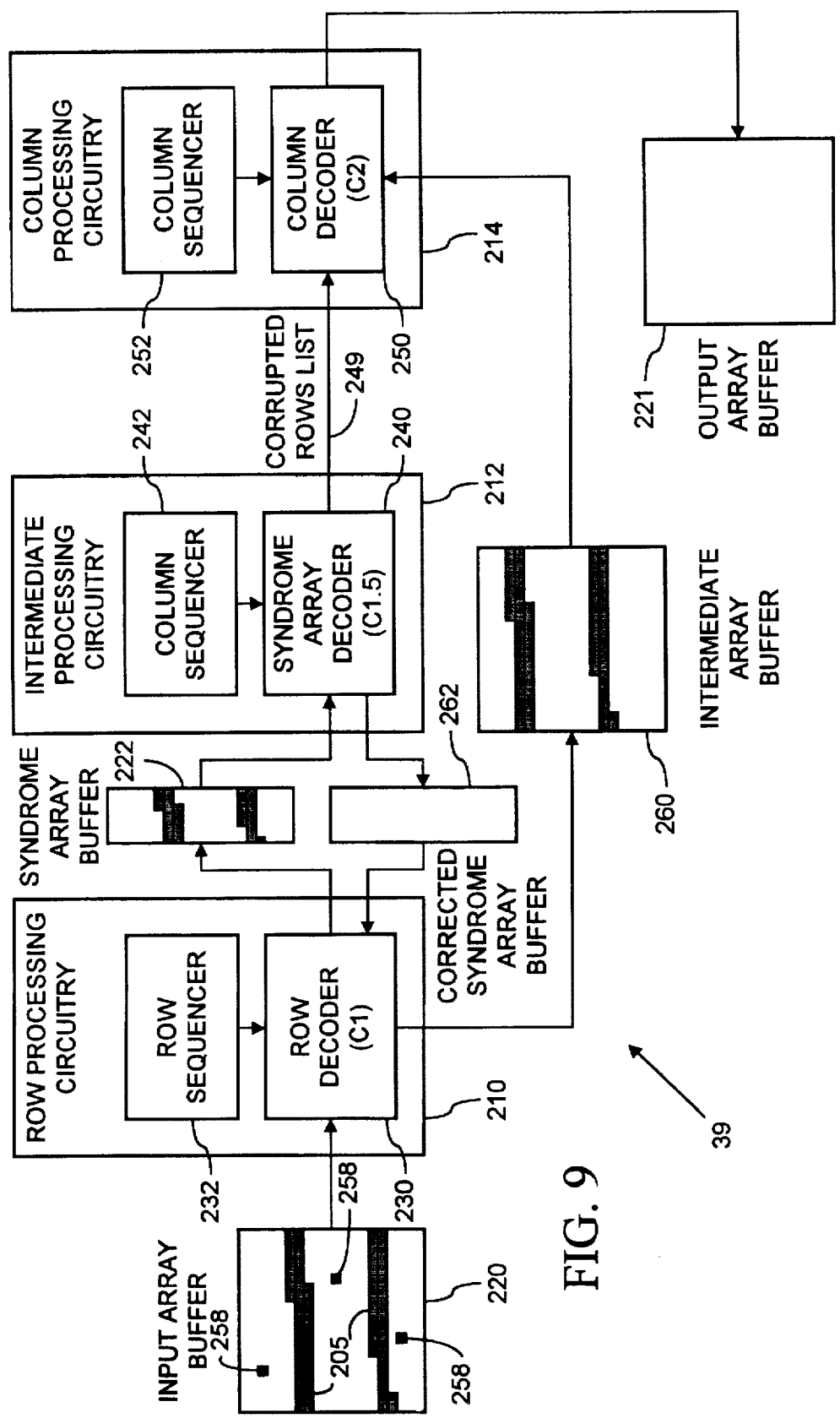
FIG. 9 is a block diagram of a decoder that can be utilized in the system of FIG. 1 according to the preferred embodiment of the invention for correcting burst and random errors based on a two-dimensional code array with reduced redundancy.

In accordance with the invention, encoder 22 and decoder 24 of system 20 preferably are based on a two-dimensional code array with reduced redundancy, such as that illustrated in FIG. 7 and described below. In a preferred embodiment of the invention, a reduced redundancy product code encoder 36 and decoder 38, 39 which are illustrated in FIGS. 6, 8, and 9 and described more fully below are employed as encoder 22 and decoder 24, respectively.

Figure 2:
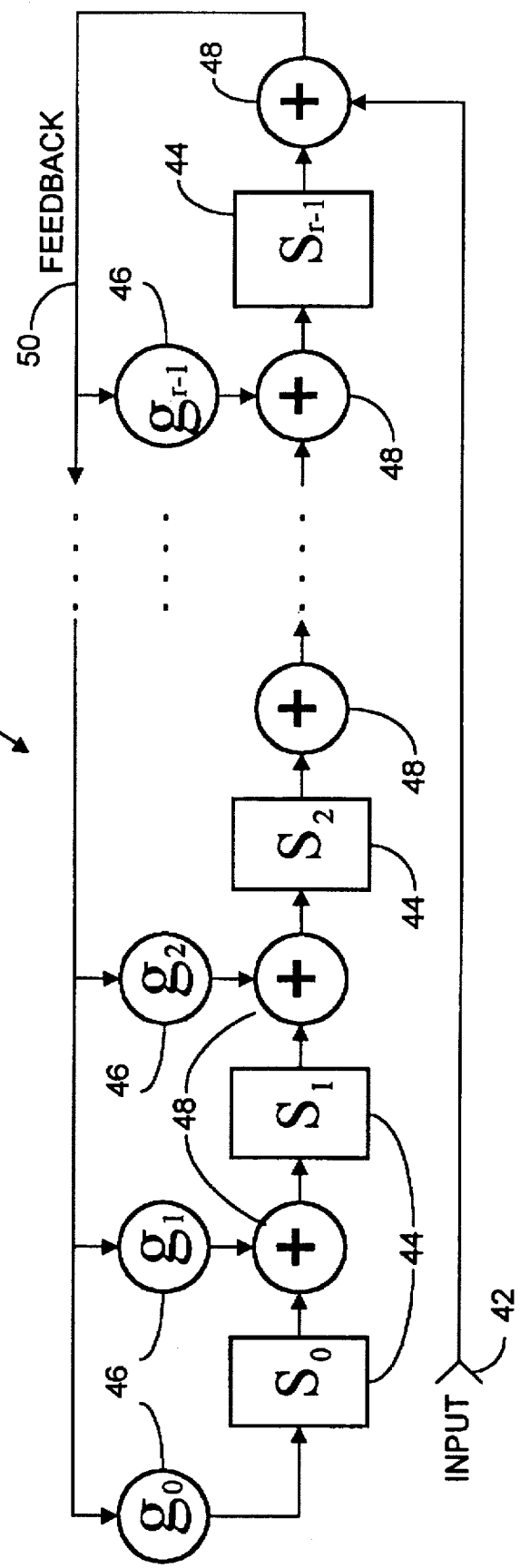
FIG. 2 is a block diagram of a typical Reed-Solomon encoder in the prior art that can be utilized for error correction encoding in the system of FIG. 1.

FIG. 2 shows a conventional implementation of a Reed-Solomon encoder as an r-stage feedback shift register encoder 40. This r-stage feedback-shift register encoder 40 operates with block codes where the redundancy of the code is r=n−k. Encoder 40 comprises an input 42 which accepts one input symbol at a time, and a plurality of shift register stages 44, labelled $S_0, S_1, S_2, \ldots, S_{r-1}$, each of which stores a symbol. Encoder 40 further comprises a plurality of generator polynomial coefficient multipliers 46, labelled $g_0, g_1, g_2, \ldots, g_{r-1}$, and adders 48 which correspond one-to-one with stages 40. The quantities of the generator polynomial coefficients used in multipliers 50 are derived from the coefficients of the generator polynomial for the Reed-Solomon code as shown in the following equation (1).

$$g(x) = \sum_{i=0}^{r} g_i x^i \quad (1)$$

($g_r$ is assumed equal to 1.) The way in which the generator polynomial is determined is well known in the art (See, e.g. S. Wicker and V. Bhargava, *Reed-Solomon Codes and Their Applications*, IEEE Press, New York, chapters 1, 5 and 10 (1994)). A feedback path 50 carries a feedback symbol which is a sum of a symbol from input 42 and a symbol in stage $S_{r-1}$. The feedback symbol is multiplied by the respective generator coefficients of multipliers 46, then summed at adders 48 with the preceding stage's symbol to form an input symbol to each stage 44. The stages 44 of register 40 are synchronously clocked, causing the input symbols to be shifted into their respective stages each clock cycle.

In an encoding operation, a block of k data symbols is shifted one per clock cycle into encoder 40 at input 46. The resulting contents of stages 44 after the k data symbols are shifted into encoder 40 comprise an integer number r of check symbols. The r check symbols are combined with the k data symbols to form an n-symbol Reed-Solomon code block.

Figure 3:
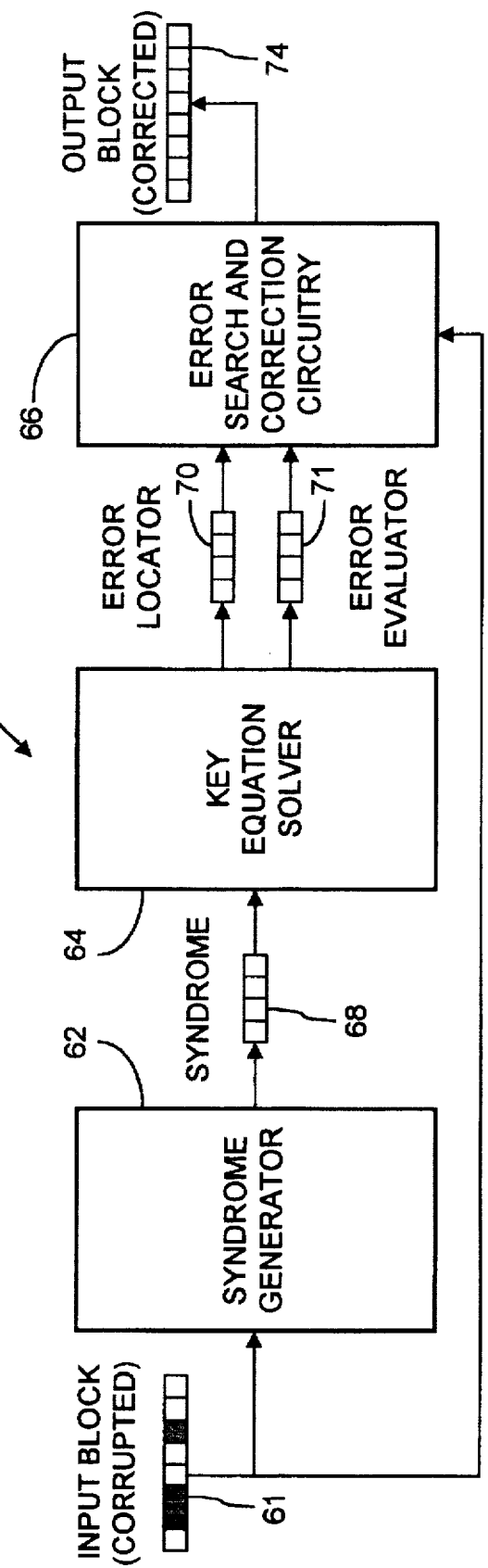
FIG. 3 is a block diagram of a typical Reed-Solomon decoder in the prior art that can be utilized for error correction decoding in the system of FIG. 1.

FIG. 3 shows a prior art Reed-Solomon decoder 60 which performs error correction on a possibly corrupted Reed-Solomon code block 61. Decoder 60 comprises a syndrome generator 62, a key equation solver 64, and an error search and correction circuitry 66. Syndrome generator 62 forms an r-symbol syndrome 68 used in error detection and correction operations from an n-symbol Reed-Solomon code block. A Reed-Solomon encoder such as r-stage feedback-shift register encoder 40 (FIG. 2) also can be utilized as syndrome generator 62. When utilized as syndrome generator 62, the n-symbol Reed-Solomon code block (comprising k data symbols and r check symbols which have been sent through noisy channel 34 (FIG. 1)) is shifted into encoder 40 at input 46 (FIG. 2). After shifting in all n-symbols of the code block, the r-symbols contained in stages 44 (FIG. 2) form a "syndrome." A non-zero syndrome detects that the n-symbol code block is corrupt. An all-zero syndrome indicates that the code block is not corrupted with a probability of 1−ε, where ε is a number that decreases exponentially with $r_1$. In general, ε is proportional to $q^{-r_1}$. The probability therefore is generally proportional to $1-q^{-r_1}$.

The syndrome also can be further processed to perform erasure and full error correction. The illustrated decoder 60 performs full error correction. Key equation solver 64 processes syndrome 68 in a well-known manner to form an error locator polynomial 70 and an error evaluator polynomial 71. Error locator and evaluator polynomials 70–71 are input to error search and correction circuitry 66 along with corrupted input code block 61. Again using conventional techniques, error search and correction circuitry 66 utilizes error locator and evaluator polynomials 70–71 to recover any corrupted symbols (shown with shading in FIG. 3), and outputs the corrected code block 74. The original k data symbols can then be extracted from the output code block 74 by omitting the r check symbols from code block 74.

R-stage feedback-shift register encoder 40 illustrated in FIG. 2 is one of many known implementations of Reed-Solomon encoders. Other implementations of Reed-Solomon encoders and decoders are described in S. Wicker and V. Bhargava, *Reed-Solomon Codes and Their Applications*, IEEE Press, New York, chapters 1, 5 and 10 (1994), which is incorporated herein by reference; and in G. Seroussi, *A Systolic Reed-Solomon Encoder*, 37 IEEE Transactions on Information Theory 1217–1220 (1991), which is incorporated herein by reference. These various conventional Reed-Solomon encoders and decoders can be used as components of encoders and decoders based on two-dimensional code arrays such as the conventional product code encoder and decoder illustrated in FIGS. 4 and 5, and the reduced redundancy product code encoder 36, and decoders 38–39 (FIGS. 6, 8 and 9) according to the preferred embodiment of the invention.

Figure 4:
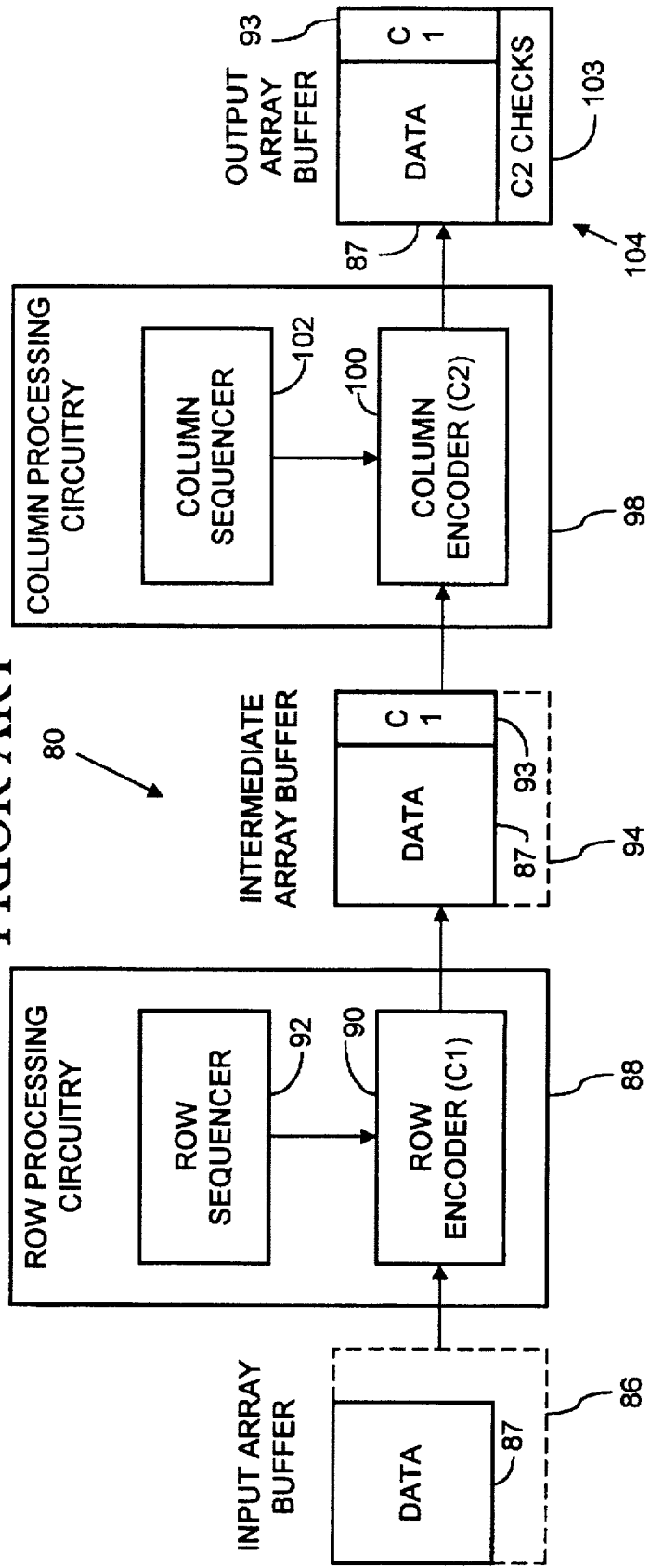
FIG. 4 is a block diagram of a typical encoder in the prior art that can be utilized for error correction encoding in the system of FIG. 1 based on a two-dimensional product code array.
Figure 5:
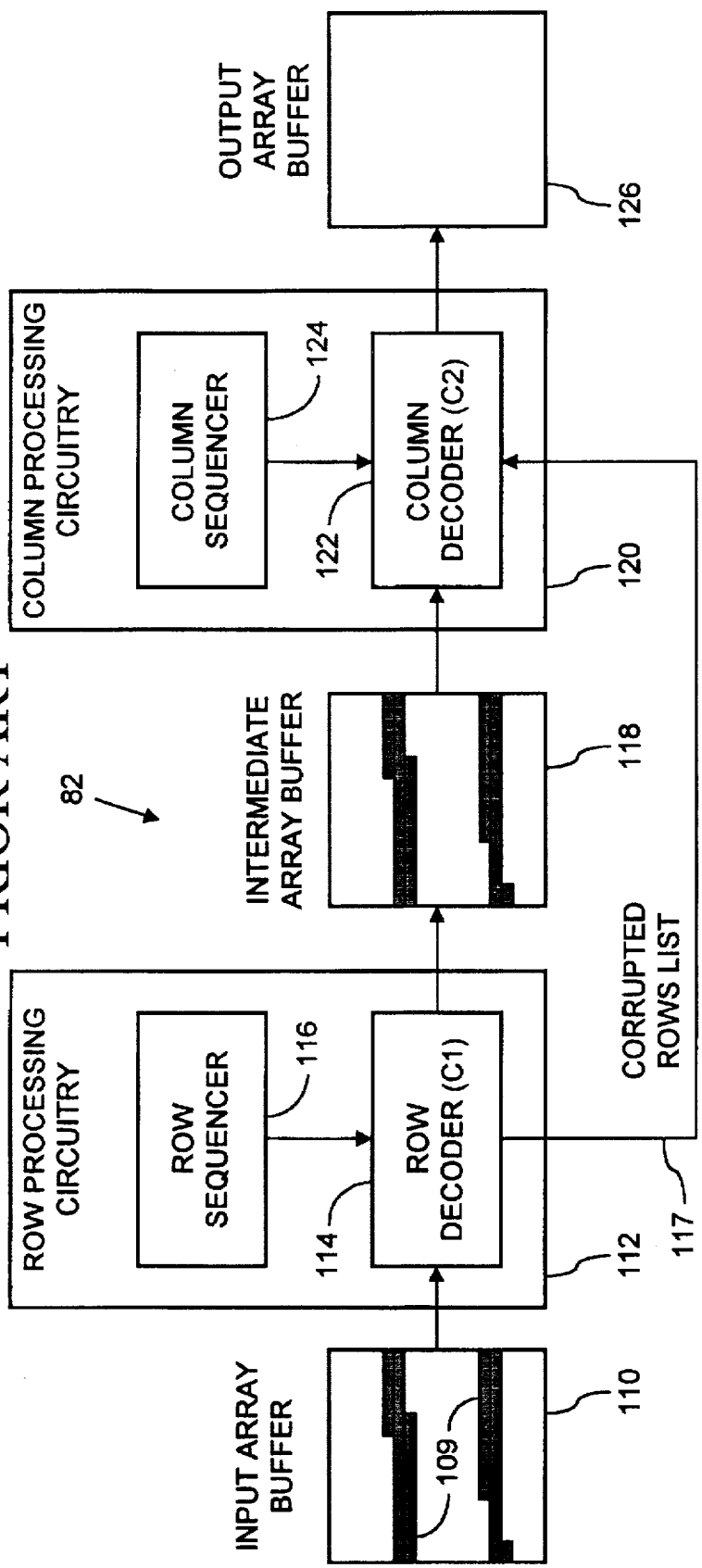
FIG. 5 is a block diagram of a typical decoder in the prior art that can be utilized for error correction decoding in the system of FIG. 1 based on a two-dimensional product code array.

FIGS. 4 and 5 show a typical prior art product code encoder 80 (FIG. 4) and decoder 82 (FIG. 5). Product code encoder 80 and decoder 82 are based on a two-dimensional code array referred to as a product code. The product code generally utilizes two Reed-Solomon codes, a first code $C_1$ which is applied to its rows, and a second code $C_2$ which is applied to its columns.

With reference to FIG. 4, product code encoder 80 forms the product code array by applying the $C_1$ code to rows of a raw data block of $k_1$ by $k_2$ symbols, then applying the $C_2$ code to columns of the codes resulting from application of the first code $C_1$. Raw data 87 to be encoded is stored in $k_2$ rows having $k_1$ symbols each of an input array buffer 86. Row processing circuitry 88 comprising a row encoder 90 and a row sequencer 92 apply the $C_1$ code to the rows of raw data in input array buffer 86. Row encoder 90 is a Reed-Solomon encoder, such as Reed-Solomon encoder 40 (FIG. 2), which encodes with a redundancy $r_1$. Row sequencer 92 inputs the raw data row-by-row from input array buffer 86 to row encoder 90. Row encoder 90 processes each row of $k_1$ raw data symbols 87 to form $r_1$ check symbols 93 for the row as described above. The $k_1$ raw data symbols 87 and $r_1$ check symbols 93 of each row form a $C_1$ code of length n, symbols which is stored by row processing circuitry 80 in an intermediate array buffer 94.

Column processing circuitry 98 comprising a column encoder 100 and column sequencer 102 apply the $C_2$ code to the columns of the $C_1$ codes (consisting of raw data 87 and $C_1$ check symbols 93) in intermediate array buffer 94. Column encoder 100 is Reed-Solomon encoder, such as Reed-Solomon encoder 40 (FIG. 2), which encodes with a redundancy $r_2$. Column sequencer 102 inputs the $C_1$ codes column-by-column to column encoder 100. Column encoder 100 processes each column consisting of $k_2$ symbols to form $r_2$ check symbols 103, which are stored along with the columns in an output array buffer 104. The contents of output array buffer 104 after all columns are encoded is the product code array.

In some implementations of product code encoder 80, a single array buffer is employed as each of input array buffer 86 intermediate array buffer 94 and output array buffer 104. In such case, row and column processing circuitry 88, 98 operate on the data in place, rather than transferring the data between buffers as it is encoded. Further, in alternative implementations of product code encoder 80, the order of the row and column processing circuitry 88, 98 can be reversed while still producing the same product code array.

Referring now to FIG. 5, product code decoder 82 performs error correction on a product code array formed by product code encoder 80, based on a strategy utilizing code $C_1$ to detect corrupted rows of the product code array and code $C_2$ to correct erasure of the corrupted rows. The product code array, which potentially has corrupted rows 109, is initially stored in an input array buffer 110 upon receipt from channel 34 (FIG. 1). Row processing circuitry 112 is employed by product code decoder 82 to detect any corrupted rows 109 of the product code array in input array buffer 110. Row processing circuitry 112 comprises a row decoder 114 and row sequencer 116. Row decoder 114 is a Reed-Solomon decoder similar to that shown in FIG. 3, which is adapted for error detection based on the $C_1$ code. Row sequencer 116 inputs the product code array row by row from input array buffer 110 to row decoder 114. For each row, row decoder 114 forms an $r_1$ symbol syndrome, and identifies the row as corrupt if the syndrome is non-zero. Row decoder 114 then forms a list ("corrupted rows list") 117 identifying which rows were detected as being corrupted. After processing by row processing circuitry 112, the product code array is stored unchanged in an intermediate array buffer 118.

Product code decoder 82 further comprises a column processing circuitry 120 which it employs to correct erasure of the corrupted rows detected by row processing circuitry 112. Column processing circuitry 120 comprises a column decoder 122 and a column sequencer 124. Column decoder 122 is a Reed-Solomon decoder similar to that shown in FIG. 3, which is adapted for erasure correction operations based on the $C_2$ code. Column sequencer 124 inputs the product code array column by column from intermediate array buffer 118 to column decoder 122. The corrupted rows list 117 also is input from row decoder 114 to column decoder 122. With the corrupted rows list 117, column decoder 122 declares each of the corrupted rows 109 identified in list 117 to be erased. For each column of the product code array, column decoder 122 then corrects erasures in the column by forming a syndrome of length $r_2$ symbols for the column, and processing the syndrome to correct each symbol in the column from the erased rows. Column decoder 122 stores the corrected columns into an output array buffer 126. As a result of the processing by row and column processing circuitry 112, 120, output array buffer 126 contains the product code array with each of corrupted rows 109 corrected. Product array decoder 82 also can be implemented with a single array buffer employed as each of input array buffer 110, intermediate array buffer 118, and output array buffer 126, with the product code array being processed in place.

As discussed in the background of the invention above, the $n_1 \times n_2$ product code array formed by prior art product array encoder 80 has redundancy $n_1 r_2 + n_2 r_1 - r_1 r_2$ symbols. With this redundancy, prior art product array decoder 82 can detect whether any of the product code array's $n_2$ rows are corrupted. (Row decoder 90 forms a separate syndrome for each row, which identifies the row as being corrupted if the syndrome is non-zero.) Product array decoder 82, however, can only correct up to $r_2$ corrupted rows which have been identified as being corrupted. (Erasure correction by column decoder 100 is limited to correcting $r_2$ symbols per column of the product code array.) The cost in redundancy to identify more than $r_2$ rows as being corrupted therefore is wasted.

FIGS. 6, 8, and 9 show reduced redundancy product code encoder 36 (FIG. 6) and decoders 38, 39 (FIGS. 8 and 9) according to a preferred embodiment of the invention. Encoder 36 and decoders 38, 39 are based on a two-dimensional product code array 130 shown in FIG. 7 which utilizes an additional intermediate code $C_{1.5}$ to achieve a reduced redundancy (i.e. $(n_1 r_2 + r_1 r_2)$ in the preferred embodiment) as compared to typical prior art product array code codecs (i.e. encoder/decoders) while providing equivalent capability for burst and random error correction.

Code $C_{1.5}$ has block length $n_2$ and redundancy $2r_2$. Additionally, in the preferred embodiment, code $C_{1.5}$ is designed to be a subcode of $C_2$, i.e. code blocks of $C_{1.5}$ contain the $r_2$ redundant check symbols computed as for $C_2$, plus an additional set of $r_2$ check symbols. Consequently, code blocks encoded with code $C_2$ already satisfy half of the redundancy constraints necessary to be valid code blocks under $C_{1.5}$. This overlap between $C_{1.5}$ and $C_2$ contributes to the redundancy reduction, and can also simplify the design of the encoding and decoding circuitry, since parts of the circuitry used for $C_2$ also can be used for $C_{1.5}$. In the encoders/decoders of FIGS. 6, 8, and 9, we assume that the above relation exists between $C_{1.5}$ and $C_2$.

Figure 7:
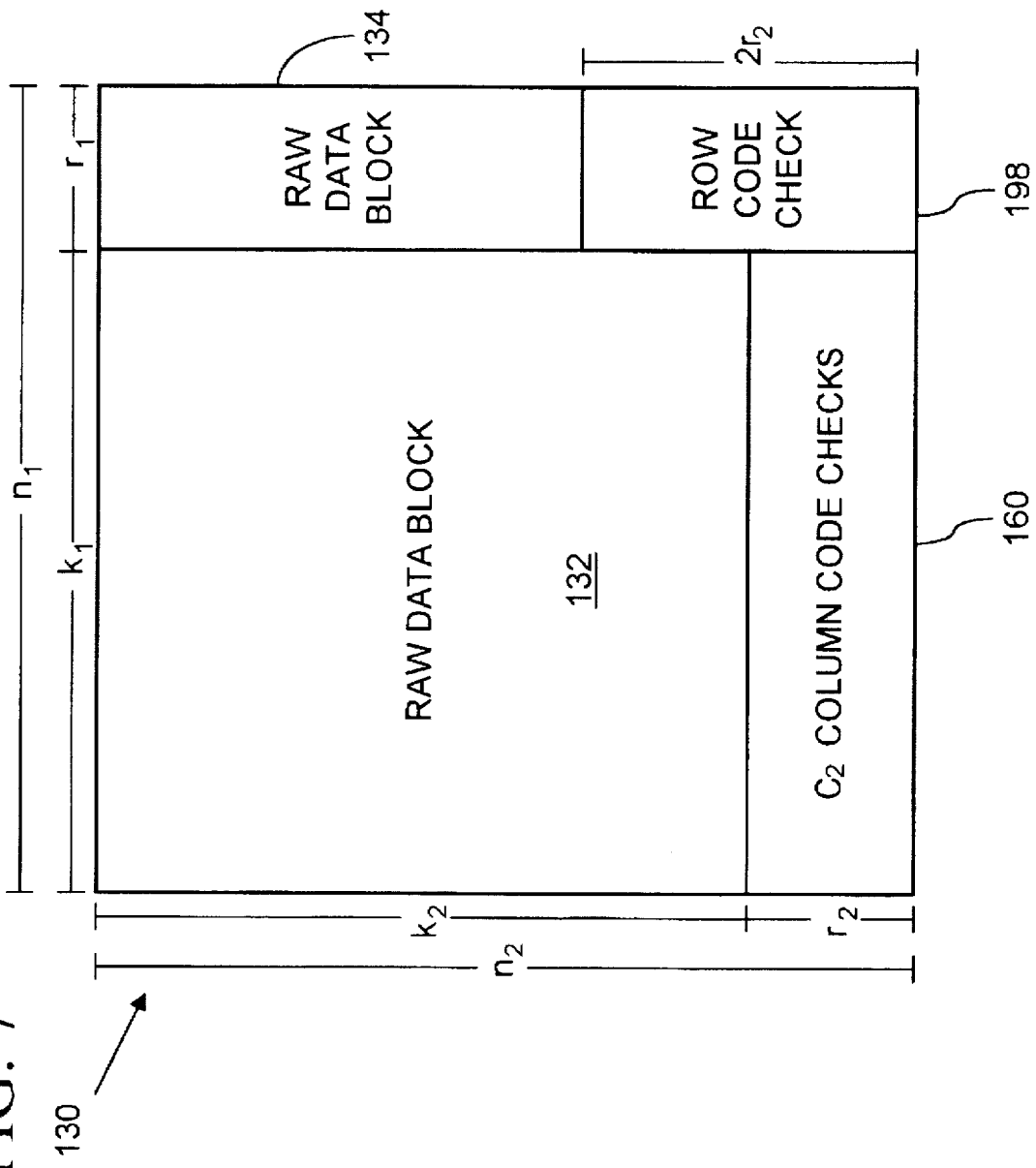
FIG. 7 is a block diagram illustrating the two-dimensional code array with reduced redundancy encoded accorded to the invention by the encoder of FIG. 6.

Referring now to FIGS. 6 and 7, reduced redundancy product code encoder 36 (FIG. 6) encodes raw data blocks 132, 134 (FIG. 7) to form reduced redundancy product code array 130 (FIG. 7). Encoder 36 comprises column processing circuitry 140 to apply a Reed-Solomon code $C_2$ with redundancy $r_2$ symbols on columns of product code array 130, row processing circuitry 142 to apply a Reed-Solomon code $C_1$ with redundancy $r_1$ symbols to rows of product code array 130, column processing circuitry 144 to apply an intermediate Reed-Solomon code $C_{1.5}$ with redundancy $r_{1.5}$ symbols to row checks formed by row processing circuitry 142, and an XOR adder 146. Encoder 36 additionally comprises an input array buffer 150, and intermediate array buffer 151, an output array buffer 152, and checks array buffers 154–155 in which product code array 130 and check symbols are stored. Input, intermediate, and output array buffers 150–152 can be physically implemented as a single buffer memory in which product code array 130 is encoded in place.

Encoding of product code array 130 by encoder 36 begins by input array buffer 150 initially storing raw data symbols which are to be encoded. In the preferred embodiment, raw data is stored into input array buffer 50 as raw data blocks 132, 134. Raw data block 132 fills a $k_1$ by $k_2$ symbol portion of product code array 130, while raw data block 134 fills an $r_1$ by $(n_2-2r_2)$ symbol portion for a total of $(k_1k_2+r_1(n_2-2r_2))$ raw data symbols. Raw data symbols can be stored into raw data blocks 132, 134 in various ways, including, for example, sequentially as $n_1-2r_2$ rows of $n_1$ symbols each plus $r_2$ rows of $k_1$ symbols each.

Next, column processing circuitry 140 encodes columns of raw data block 132 with the $C_2$ column code to form an array of $C_2$ column code checks 160 (FIG. 7) with dimensions $k_1$ by $r_2$ symbols. For encoding with the $C_2$ code, column processing circuitry 140 comprises a column encoder 162 and a column sequencer 164. Column encoder 162 is a Reed-Solomon encoder which can be suitably implemented as a feedback-shift register encoder with $r_2$ stages such as illustrated in FIG. 2, or, alternatively, as a systolic array or other architecture described in S. Wicker and G. Seroussi. Column sequencer 164 inputs raw data block 132 column by column into column encoder 162. Column encoder 162 processes each of the $k_1$ columns of data block 132 (each having length $k_2$ symbols) to form the $C_2$ column code checks 160. Column processing circuitry 140 outputs the $C_2$ column code checks 160 to fill a $k_1$ by $r_1$ symbol portion of intermediate array buffer 151. A remaining $r_1$ by $2r_2$ symbol portion 168 of intermediate array buffer 151 is cleared (i.e. filled with zeroes). (As an alternative to clearing portion 168, row processing circuitry 142 can process only the first $k_1$ symbols of the last $2r_2$ rows of product code array 130 when encoding with the $C_1$ code as described immediately below.)

Row processing circuitry 142 encodes rows of raw data blocks 132, 134 and $C_2$ column code checks 160 in intermediate array buffer 151 to form an array of $C_1$ row code checks (comprising portions 170-171) with dimensions $r_1$ by $n_2$ symbols. For encoding with the $C_1$ code, row processing circuitry 142 comprises a row encoder 172 and a row sequencer 174. Row encoder 172 is a Reed-Solomon encoder which can be suitably implemented as a feedback-shift register encoder with $r_1$ stages such as illustrated in FIG. 2, or, alternatively, as a systolic array or other architecture described in Appendices A and B. Row sequencer 174 inputs symbols from intermediate array buffer 151 row by row into row encoder 172. Row encoder 172 processes each of the $n_2$ rows (which each comprise $n_1$ symbols) to form $C_1$ row code checks which are stored in $C_1$ checks array buffer 154.

$C_1$ checks array buffer 154 inputs a portion 170 (having dimensions $r_1$ by $n_2-2r_2$ symbols) of $C_1$ row code checks array which correspond to the first $n_2-2r_2$ rows of product code array 130 (i.e. each of the full rows of $n_1$ raw data symbols) into column processing circuitry 144. A remaining portion 171 (having dimension $r_1$ by $2r_2$ symbols) of $C_1$ code checks array corresponding to the last $2r_2$ rows of product code array 130 are saved in the last $2r_2$ rows of buffer 154.

Column processing circuitry 144 encodes columns of portion 170 of $C_1$ row code checks array in buffer 154 to form an array 155 of $C_{1,5}$ column code checks with dimensions $r_1$ by $2r_2$ symbols. For encoding with the $C_{1,5}$ code, column processing circuitry 144 comprises a column encoder 192 and a column sequencer 194. Column encoder 192 is a Reed-Solomon encoder which can be suitably implemented as a feedback-shift register encoder with $r_{1,5}$ stages such as illustrated in FIG. 2, or, alternatively, as a systolic array or other architecture described in S. Wicker and Seroussi. Column sequencer 194 inputs symbols from $C_1$ checks array portion 170 in buffer 154 column by column into column encoder 192. Column encoder 192 processes each of the $r_1$ columns (which each comprise $n_2-2r_2$ symbols) to form the $C_{1,5}$ column code checks array. Column processing circuitry 144 output the $C_{1,5}$ column code checks array into $C_{1,5}$ checks array buffer 155.

XOR adder 146 sums by bitwise exclusive-or operation the $C_{1,5}$ column code checks array in buffer 155 with portion 171 of $C_1$ row code checks array in buffer 154 symbol by symbol to form an array 198 of row code checks with dimensions of $r_1$ by $2r_2$ symbols. The row code checks array 198 is stored into output array buffer 152 with raw data block 132, 134 and $C_2$ column code checks 160. The resulting contents of output array buffer 152 forms reduced redundancy product code array 130 (FIG. 7).

The redundancy portion of product code array 130 constitutes only the $C_2$ column code checks 160 and row code checks 198, which consist of a total of $n_1r_2+r_1r_2$ symbols. This is $r_1(n_2-2r_2)$ symbols fewer than the redundancy of the product code array formed by prior art product array encoder 80 (which has a redundancy of $n_1r_2+n_2r_1-r_1r_2$ symbols). Reduced redundancy product code encoder 36 thus realizes a significant savings in redundancy over prior art product code encoder 80 (FIG. 5) for product codes of equal dimensions. With typical product code dimensions of $n_1=128$, $r_1=12$, $n_2=98$, and $r_2=8$, for example, the savings in redundancy realized by reduced redundancy product code encoder 36 is shown in the following Table 2.

TABLE 2

Comparison of Prior Art and Reduced Redundancy Product Code Encoders.

| | Prior Art Product Code Encoder 80 | Reduced Redundancy Product Code Encoder 36 |
| --- | --- | --- |
| Product Code Length | 12544 | 12544 |
| Product Code Redundancy | 2104 | 1120 |
| Redundancy/ Length | 16.8% | 8.9% |
| Redundancy/ Raw Data | 20.2% | 9.8% |

Referring now to FIG. 8, reduced redundancy product code decoder 38 decodes product code array 130 (FIG. 7) formed by reduced redundancy product code encoder 36 (FIG. 6) to correct burst errors introduced in transferring product code array 130 through channel 34 (FIG. 1). Decoder 38 utilizes the $C_1$ row code and $C_{1,5}$ intermediate code to locate up to $r_2$ rows ("corrupted rows") 205 of product code array 130 that were corrupted during transfer through channel 34. Decoder 38 then utilizes the $C_2$ column code for erasure correction of the corrupted rows 205. Reduced redundancy product code decoder 38 therefore provides error correction capability equivalent to prior art product array decoder 82 (FIG. 5) with the reduced redundancy of product code array 130.

To process product code array 130 utilizing the $C_1$, $C_{1,5}$, and $C_2$ codes, decoder 38 comprises a row processing circuitry 210, an intermediate processing circuitry 212, and a column processing circuitry 214. Decoder 38 further comprises an input array buffer 220, an output array buffer 221, and a syndrome array buffer 222. A single physical buffer can be employed as both input and output array buffers 220–221, by processing the product code array in place. After being transferred through channel 34, product code array 130 is initially stored into input array buffer 220.

Row processing circuitry 210 processes rows of the product code array in input array buffer 220 with the $C_1$ code to form a syndrome array. To form the syndrome array, row processing circuitry 210 comprises a row decoder 230 and row sequencer 232. Row decoder 230 is a Reed-Solomon encoder used as a syndrome generator (as described above with reference to FIG. 3) which can be suitably implemented as a feedback-shift register encoder with $r_1$ stages such as illustrated in FIG. 2, or, alternatively, as a systolic array or other architecture described in S. Wicker and Seroussi. Row sequencer 232 inputs symbols from input array buffer 220 row by row into row decoder 230. Row decoder 230 processes each of the $n_2$ rows (which comprise $n_1$ symbols each) of the product array to yield a corresponding syndrome having $r_1$ symbols. Row processing circuitry 210 outputs the syndromes into rows of syndrome array buffer 222 corresponding to rows of input array buffer 220 to form the syndrome array.

Intermediate processing circuitry 212 processes columns of the syndrome array according to the $C_{1.5}$ code to locate corrupted rows 205 of the product array. Intermediate processing circuitry 212 comprises a syndrome array decoder 240 and a column sequencer 242. Syndrome array decoder 240 is a Reed-Solomon decoder which can be implemented similarly to decoder 60 of FIG. 3 with a syndrome generator and key equation solver. Column sequencer 242 inputs symbols from syndrome array buffer 222 into syndrome array decoder 240 one column at a time. Syndrome array decoder 240 then forms an $r_{1.5}$-symbol syndrome for each column of the syndrome array, and processes the $C_{1.5}$-symbol syndrome to determine error locations. The rows of the syndrome array in which errors are located correspond to corrupted rows 205 of the product array in input array buffer 220.

In the case of burst errors, each column of the syndrome array is likely to have errors in the same rows of the syndrome array. Consequently, most of corrupted rows 205 will be located in processing just one column of the syndrome array. Further, there is a high likelihood that all corrupted rows 205 will be located after processing just a few columns. Accordingly, in some embodiments of the invention, intermediate processing circuitry 212 can process only some of the $r_1$ columns of the syndrome array (two or three columns for example) so as to speed up the decoding process at the sacrifice of a very small chance of failing to detect some of corrupted rows 205. Alternatively, corrupted rows 205 can be located using only the first few columns, and the rest of the columns can be used to verify their locations. When a discrepancy is found, an additional column is fully processed. As a result of processing the syndrome array columns, syndrome array decoder 240 produces a corrupted rows list 249 which is output to column processing circuitry 214.

Column processing circuitry 214 performs erasure correction of corrupted rows 205 in the product array based on corrupted rows list 249. Column processing circuitry 214 comprises a column decoder 250 and a column sequencer 252. Column decoder 250 is a Reed-Solomon decoder which can be implemented similarly to decoder 60 shown in FIG. 3 with a syndrome generator, key equation solver, and error search and correction circuitry. Column sequencer 252 inputs the product code array column by column from input array buffer 220 to column decoder 250. Corrupted rows list 249 also is input to column decoder 250. With corrupted rows list 249, column decoder 250 declares each of the corrupted rows 205 identified in list 249 to be erased. For each column of the product code array, column decoder 250 then corrects erasures in the column by forming a syndrome of length $r_2$ symbols for the column, and processing the syndrome to correct each symbol from the erased rows in the column. Column decoder 250 stores the corrected columns into an output array buffer 221. As a result of processing by row, intermediate, and column processing circuitry 210, 212, and 214, output array buffer 221 contains the product code array with each of corrupted rows 205 corrected (with very high probability).

Referring now to FIG. 9, decoder 38 is modified in reduced redundancy product code decoder 39 to decode product code array 130 (FIG. 7) to correct both burst and random errors introduced in transferring product code array 130 through channel 34 (FIG. 1). As in decoder 38, decoder 39 utilizes the $C_1$ row code and $C_{1.5}$ intermediate code to locate up to $r_2$ corrupted rows 205 of product code array 130, then utilizes the $C_2$ column code for erasure correction of the corrupted rows 205. Decoder 39 additionally utilizes the $C_{1.5}$ intermediate code and $C_1$ row code to correct random errors 258 in product code array 130. The reduced redundancy of product code array 130 therefore can be used to provide both random and burst error protection.

In addition to row, intermediate, and column processing circuitry 210, 212, 214 and buffers 220–222, reduced redundancy product code decoder 39 comprises an intermediate array buffer 260 and a corrected syndrome array buffer 260. In some embodiments of the invention, syndrome array buffer 222 and corrected syndrome array buffer 262 can be implemented as a single physical buffer, and input array buffer 220, output array buffer 221, and intermediate array buffer 260 can all be implemented as a second single physical buffer.

In decoder 39, row processing circuitry 210 encodes rows of product code array 130 in input array buffer 220 with the $C_1$ row code to form a syndrome array. Row processing circuitry 210 outputs the syndrome array to syndrome array buffer 222. Intermediate processing circuitry 212 processes columns of the syndrome array in syndrome array buffer 222 with the $C_{1.5}$ intermediate code to yield corrupted row list 249, and to correct errors in the syndrome array. Intermediate processing circuitry 212 outputs corrupted rows list 249 to column processing circuitry 214, and the corrected syndrome array to corrected syndrome array buffer 262.

Row processing circuitry 210 utilizes the corrected syndrome array to correct random errors 258 in rows of the product code array in input array buffer 220. Row decoder 230 of row processing circuitry is implemented similarly to decoder 60 of FIG. 3, with a key equation solver and error search and correction circuitry. With these components of row decoder 230, row processing circuitry 210 locates and corrects random errors 258, and outputs the resulting product code array to intermediate array buffer 260.

Column processing circuitry 214 then processes columns of the product code array in intermediate array buffer 260 with the $C_2$ column code for erasure correction of corrupted rows 205 identified in corrupted rows list 249. The product code array with both random and burst errors 205, 258 corrected is output to output array buffer 221.

Having described and illustrated the principles of our invention with reference to a preferred embodiment, it will be recognized that the preferred embodiment can be modified in arrangement and detail without departing from such principles. In view of the many possible embodiments to which the principles of our invention may be applied, it should be recognized that the detailed embodiments are illustrative only and should not be taken as limiting the scope of our invention. Rather, we claim as our invention all such embodiments as may come within the scope and spirit of the following claims and equivalents thereto.

We claim:

1. A method of reducing redundancy in an error correcting system having a data source, a data sink, and a channel which transfers data from the data source to the data sink, the method comprising:

encoding columns in a first block of raw data symbols at the data source in an $n_1$ by $n_2$ symbol product code array, into an array of column code checks;

encoding rows of raw data symbols from the first block combined with rows of a second block of raw data symbols and rows of the column code checks into an array of row code checks;

encoding columns for a first portion of the row code checks into an intermediate column code checks:

combining the intermediate column code checks with a second portion of the row code checks thereby forming a reduced row code checks derived from both first and second raw data block and the column code checks:

forming a reduced redundancy product code array including the first and second block of raw data symbols the column code checks for the first raw data block and the reduced row code checks the reduced redundancy product code array having a redundancy of $n_1r_2+r_1r_2$ symbols, whereby up to $r_2$ corrupted rows of the array can be detected and up to $r_2$ erasures in each column corrected, wherein $n_1, n_2, r_1,$ and $r_2$ are positive integers and each symbol is taken from an alphabet having an integer number q of symbols;

transmitting the reduced redundancy product code array on the communications channel to the destination; and decoding the reduced redundancy product code array at the destination to recover the raw data symbols.

2. The method of claim 1 wherein the communications channel is a bursty noise channel.

3. The method of claim 1 wherein the step of decoding comprises:

processing the reduced redundancy product code array and the redundancy to identify corrupted rows of the reduced redundancy product code array whereby a probability of identifying and correcting the corrupted rows is substantially the same as that of a non-reduced redundancy product code array having a redundancy of $n_1r_2+n_2r_1-r_1r_2$; and processing the reduced redundancy product code array and the redundancy to correct those rows of the reduced redundancy product code array identified as corrupted.

4. The method of claim 1 wherein the step of encoding raw data symbols comprises encoding the raw data symbols with a column code of redundancy $r_2$, a row code of redundancy $r_1$, and an intermediate code of redundancy $2r_2$, where the intermediate code is a subcode of the column code.

5. The method of claim 1 wherein the step of encoding comprises:

filling a first portion and a second portion of the reduced redundancy product code array with raw data symbols, the first and second portions of the reduced redundancy product code array having dimensions $k_1$ by $k_2$ symbols and $r_1$ by $k_2-r_2$ symbols, respectively, wherein $k_1$ and $k_2$ are integers;

processing columns of the first portion of the reduced redundancy product code array according to a first coding to form first coding checks of length $r_2$ symbols associated one to one to the columns of the first portion;

filling a third portion of the reduced redundancy product code array with the first coding checks, the third portion of the reduced redundancy product code array having dimensions $k_1$ and $r_2$ symbols;

processing rows of a fourth portion of the reduced redundancy product code array according to a second coding to form second coding checks of length $r_1$ symbols associated one to one to the processed rows of the fourth portion of the reduced redundancy product code array, the fourth portion of the reduced redundancy product code array having dimensions of $k_1$ by $2r_2$ symbols and consisting of the third portion of the reduced redundancy product code array and a first sub-portion of the first portion of the reduced redundancy product code array, the first sub-portion of the first portion of the reduced redundancy product code array having dimensions $k_1$ by $r_2$ symbols, the second coding checks forming a second checks array having dimensions $r_1$ by $2r_2$ symbols;

processing rows of a fifth portion of the reduced redundancy product code array according to the second coding to form third coding checks of length $r_1$ symbols associated one to one to the rows of the fifth portion of the reduced redundancy product code array, the fifth portion of the reduced redundancy product code array having dimensions $n_1$ by $n_2-2r_2$ and consisting of the second potion of the reduced redundancy product code array and a second sub-potion of the first potion of the reduced redundancy product code array, the second sub-portion of the first portion of the reduced redundancy product code array having dimensions $k_1$ by $n_2-2r_2$, the third coding checks forming a third checks array having dimensions $r_1$ by $n_2-2r_2$;

processing columns of the third checks array according to a third coding to form fourth coding checks of length $2r_2$ associated one to one to the columns of the third checks array, the fourth coding checks forming a fourth checks array having dimensions $r_1$ by $2r_2$;

summing the fourth checks array with the second checks array; and filling a sixth portion of the reduced redundancy product code array with the sum of the fourth cheeks array and the portion of the second checks array.

6. The method of claim 5 wherein the first through fourth coding checks constitute Reed-Solomon codes.

7. The method of claim 5 wherein the third coding is a subcode of the first coding.

8. The method of claim 5 wherein the step of decoding comprises:

processing rows of the reduced redundancy product code array according to the second coding to form a syndrome array of dimensions $r_1$ by $n_2$;

processing at least one column of the syndrome array according to the third coding to identify up to $r_2$ corrupted rows of the reduced redundancy product code array for erasure; and processing columns of the reduced redundancy product code array according to the first coding to correct those rows identified for erasure.

9. The method of claim 1 wherein the step of decoding comprises:

processing rows of the reduced redundancy product code array according to a second coding of redundancy $r_1$ to form a syndrome array of dimensions $r_1$ by $n_2$ symbols;

processing at least one column of the syndrome array according to a third coding of redundancy $2r_2$ to identify up to $r_2$ corrupted rows of the reduced redundancy product code array for erasure; and processing columns of the reduced redundancy product code array according to a first coding of redundancy $r_2$ to correct those rows identified for erasure.

10. The method of claim 1 wherein the step of encoding comprises:

in the reduced redundancy product code array, filling columns one through $n_1$ of rows one through $n_2-2r_2$ and columns one through $k_1$ of rows $n_2-2r_2+1$ through $n_2-r_2$ with raw data symbols;

forming first column coding checks for the raw data symbols in rows one through $k_2$ of columns one through $k_1$ of the reduced redundancy product code array, wherein the first column checks are associated one-to-one with the columns and each has length $r_2$;

in the reduced redundancy product code array, filling columns one through $k_1$ of rows $n_2-r_2+1$ through $n_2$ with the first column coding checks;

forming partial row coding checks for the raw data symbols and first column coding checks in columns one through $k_1$ of rows $n_2-2r_2+1$ through $n_2$ of the reduced redundancy product code array, wherein the partial row coding checks are associated one-to-one with the rows and each has length $r_1$;

saving the partial row coding checks associated with rows $n_2-2r_2+1$ through $n_2$ of the reduced redundancy product code array;

forming complete row coding checks for the raw data symbols in columns one through $n_1$ of rows one through $n_2-2r_2$ of the reduced redundancy product code array, wherein the complete row coding checks are associated one-to-one with the rows and each has length $r_1$;

forming second column coding checks for columns of the complete row coding checks, wherein the second column coding checks are associated one-to-one with the columns and each has length $2r_2$;

summing the saved partial row coding checks and the second column coding checks; and in the reduced redundancy product code array, filling columns $k_1+1$ through $n_1$ of rows $n_2-2r_2+1$ through $n_2$ with the summed partial row coding checks and second column coding checks.

11. The method of claim 10 wherein the coding checks all constitute Reed-Solomon codes.

12. The method of claim 10 wherein the step of decoding comprises:

forming row syndromes for the raw data symbols and checks in columns 1 through $n_1$ of rows 1 through $n_2$ of the reduced redundancy product code array, wherein the row syndromes are associated one-to-one with the rows of the reduced redundancy product code array and each has length $r_1$, the row syndromes forming a row syndrome array having dimensions $r_1$ by $n_2$;

forming at least one first column syndrome of at least one column of the row syndrome array, wherein the at least one first column syndrome is associated one-to-one to the at least one column of the row syndrome array and each first column syndrome has length $2r_2$;

using the at least one column syndrome to identify corrupted rows of the reduced redundancy product code array;

forming second column syndromes for the raw data symbols and checks in rows 1 through $n_2$ of columns 1 through $n_1$ of the reduced redundancy product code array, wherein the second column syndromes are associated one-to-one to the columns of the reduced redundancy product code array and each has length $r_2$; and using the second column syndromes to correct erasure of the corrupted rows of the reduced redundancy product code array.

13. The method of claim 1 wherein the step of decoding comprises:

forming row syndromes of columns 1 through $n_1$ of rows 1 through $n_2$ of the reduced redundancy product code array, wherein the row syndromes are associated one-to-one with the rows of the reduced redundancy product code array and each has length $r_1$, the row syndromes forming a row syndrome array having dimensions $r_1$ by $n_2$;

forming at least one first column syndrome of at least one column of the row syndrome array, wherein the at least one first column syndrome is associated one-to-one to the at least one column of the row syndrome array and each first column syndrome has length $2r_2$;

using the at least one first column syndrome to identify corrupted rows of the reduced redundancy product code array;

forming second column syndromes for the raw data symbols and checks in rows 1 through $n_2$ of columns 1 through $n_1$ of the reduced redundancy product code array, wherein the second column syndromes are associated one-to-one to the columns of the reduced redundancy product code array and each has length $r_2$; and using the second column syndromes to correct erasure of the corrupted rows of the reduced redundancy product code array.

14. An error correction system utilizing a reduced redundancy product code array, the system comprising:

an array buffer having $n_1$ columns and $n_2$ rows for storing raw data symbols in columns one through $n_1$ of rows one through $(k_2-r_2)$ and in columns one through $k_1$ of rows $(k_2-r_2+1)$ through $k_2$, where $n_1$, $n_2$, $k_1$, $k_2$, $r_1$, and $r_2$ are positive integer numbers satisfying relations $n_1=k_1+r_1$ and $n_2=k_2+r_2$;

a column encoder for encoding the raw data symbols in columns one through $k_1$ of the array buffer with a column code to form column checks of length $r_2$ symbols, the column checks being associated one to one to the columns and stored in rows $(k_2+1)$ through $n_2$ of their respective associated columns of the array buffer;

a row encoder for encoding the raw data in rows one through $(k_2-r_2)$ of the array buffer with a row code to form first row checks of length $r_1$ symbols, and for encoding the raw data symbols and column check symbols in rows $(k_2-r_2+1)$ through $n_2$ of the array buffer with the row code to form second row checks of length $r_1$ symbols;

a column encoder for encoding columns of the first row checks with an intermediate code to form intermediate checks of length $2r_2$ symbols;

an adder for summing the second row checks and the intermediate checks to form a checks array with dimensions $r_1$ symbols by $2r_2$ symbols derived from the raw data symbols in columns one through $n_1$ of rows one through $(k_2-r_2)$, the raw data symbols in columns one through $k_1$ of rows ($k_2-r_2+1$) through $k_2$ and the column checks in rows ($k_2+1$) through $n_2$, the checks array being stored in columns ($k_1+1$) through $n_1$ of rows ($k_2-r_2+1$) through $n_2$ of the array buffer, thereby forming a product code array with redundancy of $n_1r_2+r_1-r_1r_2$ symbols while maintaining substantially equal error correction capability for a non-reduced redundancy product code array having a redundancy of $n_1r_2+n_2r_1-r_1r_2$.

15. The system of claim 14, comprising:

a row decoder for decoding rows of the product code array with the row code to form syndromes of length $r_1$ symbols, the syndromes being associated one to one with the rows of the product code array;

a syndrome array buffer having $n_2$ rows and $r_1$ columns for storing the syndromes in a syndrome array with each syndrome being stored in a row of the syndrome array buffer;

a syndrome decoder for decoding columns of the syndrome array with the intermediate code to locate any corrupted rows of the product code array; and a column decoder for decoding columns of the product code array with the column code to correct erasure of the corrupted rows of the product code array.

16. The system of claim 15, comprising:

the syndrome decoder further being operative to decode columns of the syndrome array with the intermediate code to correct any errors in the syndrome array; and the row decoder further being operative to decode rows of the product code array utilizing the corrected syndrome array to correct any random errors in the product code array.

17. An error correction system utilizing a product code array of raw data symbols comprising:

a column encoder for encoding columns of the product code array with a column code C2 forming check symbols of the column code C2;

a row encoder for encoding rows of the product code array and rows of the check symbols of the column code C2 with a row code C1 forming rows of check symbols of the row code C1, the rows of check symbols of the row code C1 associated one to one with the rows of the product code array and the rows of the check symbols of the column codes C2;

an intermediate column encoder encoding columns for a first portion of rows of the check symbols of the row code C1 into intermediate check symbols for code C1.5; and a redundancy compressor that combines the intermediate check symbols of the code C1.5 with a remaining second portion of the check symbols of row code C1 into a reduced set of row check symbols having less redundancy than the set of row check symbols while maintaining substantially the same error correction capability for the product code array.

18. The system of claim 17 including the following:

a syndrome generator for processing rows of the product code array with the row code C1 to form syndromes;

a syndrome array buffer for storing the syndromes in a syndrome array, each row in the syndrome array being associated one to one with the rows of the product code array;

a syndrome decoder for decoding columns of the syndrome array with the intermediate code C1.5 to generate a corrupted rows list for the product code array; and a column decoder performing erasure correction for corrupted rows of the product code array according to the corrupted rows list and the column codes C2.

19. An error correction system according to claim 18 wherein $n_1$, $n_2$, $r_1$, and $r_2$ are integer numbers, the system including:

a row decoder for decoding rows of the product code array with a row code to form syndromes of length $r_1$ symbols, the syndromes being associated one to one with the rows of the product code array;

a syndrome array buffer having $n_2$ rows and $r_1$ columns for storing the syndromes in a syndrome array with each syndrome being stored in a row of the syndrome array buffer;

a syndrome decoder for decoding columns of the syndrome array with an intermediate code of redundancy $2r_2$ to locate any corrupted rows of the product code array; and a column decoder for decoding columns of the product code array with a column code of redundancy $r_2$ to correct erasure of the corrupted rows of the product code array.

20. The system of claim 19, comprising:

the syndrome decoder further being operative to decode columns of the syndrome array with the intermediate code to correct any errors in the syndrome array; and the row decoder further being operative to decode rows of the product code array utilizing the corrected syndrome array to correct any random errors in the product code array.

* * * * *